(12) United States Patent
Cerisier et al.

(10) Patent No.: US 7,177,605 B2
(45) Date of Patent: *Feb. 13, 2007

(54) POWER AMPLIFICATION DEVICE, IN PARTICULAR FOR A CELLULAR MOBILE TELEPHONE

(75) Inventors: Patrick Cerisier, Copponex (FR); Giovanni Cerusa, Cremona (IT)

(73) Assignees: STMicroelectronics N.V., Amsterdam (NL); STMicroelectronics S.r.l., Agrate Brianza (IT)

(*) Notice: Subject to any disclaimer, the term of this patent is extended or adjusted under 35 U.S.C. 154(b) by 462 days.

This patent is subject to a terminal disclaimer.

(21) Appl. No.: 10/754,465

(22) Filed: Jan. 9, 2004

(65) Prior Publication Data

US 2004/0171397 A1   Sep. 2, 2004

(30) Foreign Application Priority Data

Jan. 10, 2003   (EP) .................................. 03290065

(51) Int. Cl.
*H04B 1/04* (2006.01)
*H01Q 11/12* (2006.01)

(52) U.S. Cl. ................. 455/114.2; 455/127.3; 375/297

(58) Field of Classification Search .................. 455/91, 455/126, 127.1, 127.2, 127.3, 95, 114.2, 114.3; 330/10, 291, 295; 375/297
See application file for complete search history.

(56) References Cited

U.S. PATENT DOCUMENTS 5,561,660 A * 10/1996 Kotowski et al. ........... 370/215
6,414,614 B1 * 7/2002 Melanson .................... 341/143
6,449,569 B1 * 9/2002 Melanson .................... 702/65
6,809,669 B1 * 10/2004 Robinson .................... 341/131
6,822,593 B2 * 11/2004 Level et al. ................. 341/143
6,822,594 B1 * 11/2004 Melanson et al. .......... 341/143
6,873,276 B2 * 3/2005 Yang et al. ................. 341/143
6,920,182 B2 * 7/2005 Bolton, Jr. .................. 375/247
6,943,620 B2 * 9/2005 Andersen et al. ............. 330/10
6,998,910 B2 * 2/2006 Hezar et al. .................. 330/10
2001/0001547 A1   5/2001 Delano et al. ............... 330/207
2002/0097085 A1   7/2002 Stapleton ..................... 330/10
2005/0085194 A1 * 4/2005 Robinson et al. ............. 455/91

FOREIGN PATENT DOCUMENTS

| DE | 19619208 | 11/1997 |
| WO | 00/42702 | 7/2000 |
| WO | 02/089322 | 11/2002 |

* cited by examiner

Primary Examiner—Sonny Trinh
(74) Attorney, Agent, or Firm—Lisa K. Jorgenson; Allen, Dyer, Doppelt, Milbrath & Gilchrist, P.A.

(57) ABSTRACT

A power amplification device includes an input for receiving a signal having a useful or desired frequency band, and power amplification circuitry of the delta-sigma type connected to the input. The power amplification circuitry exhibits an order greater than or equal to one in the useful frequency band, and an order greater than or equal to one outside the useful frequency band.

26 Claims, 4 Drawing Sheets

POWER AMPLIFICATION DEVICE, IN PARTICULAR FOR A CELLULAR MOBILE TELEPHONE

FIELD OF THE INVENTION

The present invention relates to power amplification devices, and in particular but not exclusively, to power amplification devices for wireless communication systems, especially cellular mobile telephones.

BACKGROUND OF THE INVENTION

In a wireless communication system, a base station communicates with a plurality of remote terminals, such as cellular mobile telephones. Frequency Division Multiple Access (FDMA) and Time Division Multiple Access (TDMA) are the traditional multiple access schemes for delivering simultaneous services to a number of terminals. The basic idea underlying the FDMA and TDMA systems is based upon sharing the available resource, respectively as several frequencies or as several time intervals, in such a way that several terminals can operate simultaneously without causing interference.

In contrast to these schemes using frequency division or time division, Code Division Multiple Access (CDMA) allows multiple users to share a common frequency and a common time channel by using coded modulation. More precisely, as is well known to the person skilled in the art, a scrambling code is associated with each base station, and this makes it possible to distinguish one base station from another. Furthermore, an orthogonal code, known by the person skilled in the art as an OVSF Code, is allotted to each remote terminal (such as, for example, a cellular mobile telephone). All the OVSF codes are mutually orthogonal, thus making it possible to distinguish one remote terminal from another.

Before sending a signal over the transmission channel to a remote terminal, the signal has been scrambled and spread by the base section using the scrambling code of the base station and the OVSF code of the remote terminal. In CDMA systems, it is again possible to distinguish between those which use a distinct frequency for transmission and reception (CDMA-FDD system), and those which use a common frequency for transmission and reception but distinct time domains for transmission and reception (CDMA-TDD system).

Third-generation terminals, such as cellular mobile telephones, must be compatible with the UMTS standard, that is, they must be capable of operating under various wireless transmission standards. Thus, they will have to be capable of operating in a system of the FDMA/TDMA type, for example according to the GSM or GPRS transmission standard, or else in communication systems of the CDMA-FDD or CDMA-TDD type, for example by using the UTRA-FDD, UTRA-TDD or IS-95 transmission standards.

The invention thus applies in particular to all terminals or components of wireless communication systems, such as cellular mobile telephones for example, regardless of the transmission standard used. This is whether the latter provides for constant envelope modulation (GSM and DCS systems, for example) or variable envelope modulation (systems of the CDMA type), although the invention is especially advantageous with respect to variable envelope modulation systems.

The radio frequency transmission circuitry of a component of a wireless communication system, such as a cellular mobile telephone for example, comprises a power amplifier for amplifying the signal to a sufficient level for transmission. In systems operating according to the CDMA standard, which exhibits variable envelope modulation, use is made of linear transmission circuitry that makes it possible to resend the amplitude of the signal without distortion.

One approach for embodying the power amplification of the transmission circuitry includes using amplification circuitry of the delta-sigma type. An example of such an architecture is described, for example, in U.S. Pat. No. 5,777,512. Amplification circuitry of the delta-sigma type intrinsically exhibits the advantage of being more competitive in terms of efficiency than conventional linear amplification means. However, the use of amplification circuitry of the delta-sigma type exhibits drawbacks that will now be discussed.

Such amplification circuitry comprises frequency selector networks that make it possible to adjust the position of the zeros of the noise transfer function, that is, to adjust the frequencies at which the quantization noise is in theory eliminated. Also, traditionally, these zeros are placed in the useful or desired transmission band in which the signal is situated, so as to comply with the signal/noise ratio required by the transmission standard used.

Also, since the major part of the quantization noise is pushed out of the useful band of the signal, it is then necessary to provide one or more post-amplifier filters at an output for the amplification circuitry of the delta-sigma type. The function of the filters includes, in particular, eliminating the quantization noise outside the useful signal band. It is in fact necessary to comply with noise templates defined by the transmission standards, and for operation outside the useful band of the signal, the noise must not exceed a certain level of energy so as not to disturb other transmissions and receptions using different transmission standards.

To satisfy such a template, the filtering carried out by the post-amplifier filter is increased, and then there will be an inevitable increase in the losses in the useful signal band. It will then be necessary to put more power on the amplifier, thereby rendering it less competitive than a conventional amplifier.

Also, this problem of eliminating the noise outside the useful signal band is all the more complex to solve when the constraints imposed by the transmission standards, in terms of energy level, differ as a function of frequency. Thus, by way of example, if a mobile telephone is intended to operate according to the W-CDMA transmission standard, whose useful transmission band is situated between 1920 MHz and 1980 MHz, then the noise level outside the useful band should not exceed −117 dBm per hertz between 925 MHz and 935 MHz and −129 dBm between 935 MHz and 960 MHz so as not to disturb GSM receptions. Moreover, the noise level should not exceed −121 dBm per hertz between 1805 MHz and 1880 MHz so as not to disturb DCS receptions.

SUMMARY OF THE INVENTION

An object of the present invention is to decrease the quantization noise in at least one frequency band of interest, and possibly several frequency bands of interest, outside the useful band of the signal. This is done to satisfy the demands of the noise templates set by the transmission standards while relaxing the constraints on the post-amplifier filter downstream of the amplification circuitry.

This and other objects, advantages and features in accordance with the present invention are provided by a power amplification device comprising an input for receiving a signal having a useful frequency band, and power amplification means of the delta-sigma type.

According to a general characteristic of the invention, the power amplification means of the delta-sigma type exhibits an order greater than or equal to one in the useful band of the signal and an order greater than or equal to one outside the useful band. Stated otherwise, the invention addresses the problem of decreasing the noise outside the useful band by modifying the conventional architecture of the amplification circuitry of the delta-sigma type.

More precisely, by envisioning an order greater than or equal to 1, and generally greater than 1, in the useful band of the signal, it is possible to tailor the position of the zeros of the noise transfer function to adjust the signal/noise ratio in the useful band. Also, by envisioning an order greater than or equal to 1 and generally greater than 1, outside of the useful band, it is possible to adjust the value of the frequency band or bands of interest that are outside this useful band and for which one wishes to minimize the quantization noise.

Through the actual construction of the amplification circuitry, the noise situated outside the useful band of the signal is eliminated, and the constraints on the post-amplifier filtering are therefore relaxed. Also, this filtering is very critical since it affects a compromise between the insertion losses in the useful signal band and the attenuation outside of this band. Also, by way of indication, a dB of loss in the signal transmitted translates into an increase in the power of the amplifier, and consequently, an increase in the consumption of current.

Decreasing the quantization noise outside the useful band makes it possible to reduce the requirements of the post-amplifier filtering, and consequently, the losses in the useful transmission band are decreased. This will ultimately translate into a gain in the consumption of current.

According to one embodiment of the invention, the power amplification circuitry or means may comprise at least one frequency selector network tuned to a frequency in the useful band, and at least one frequency selector network tuned to a frequency outside the useful band.

According to another embodiment of the invention, the power amplification device may furthermore comprise at least one signal amplifier (i.e., signal gain) connected between the input and the power amplification circuitry. The actual number of signal amplifiers may be equal to the global order, and increased by one unit, of the power amplification circuitry.

The presence of at least one signal amplifier, possibly programmable, already makes it possible to reduce the input dynamic swing of the amplification circuitry, since the signal gain acts only on the input signal. The presence of several signal gains, possibly programmable, gives greater flexibility for monitoring the total gain of the amplification circuitry, which may be set by altering the value of the signal gains.

Moreover, the presence of at least two signal amplifiers makes it possible to adjust the zeros of the polynomial transfer function of the signal. Since the zeros of the transfer function of the signal may be different from the zeros of the transfer function of the noise, it is also possible to adjust, through the presence of these signal gains, frequency values that are outside the useful band and for which one wishes to eliminate noise in the input signal. Thus, through the actual construction of the power amplification circuitry, a filtering of the input signal outside of the useful band is achieved, thereby making it possible to relax the filtering constraints on the elements situated upstream of the power amplification device.

The power amplification device according to the invention may advantageously be embodied in the form of an integrated circuit.

Another aspect of the invention is directed to a component of a wireless communication system, wherein the component comprises a power amplification device as defined above. The component may be a cellular mobile telephone or a base station, for example.

BRIEF DESCRIPTION OF THE DRAWINGS

Other advantages and characteristics of the invention will become apparent on examining the detailed description of non-limiting embodiments and the appended drawings, in which.

DETAILED DESCRIPTION OF THE PREFERRED EMBODIMENTS

Figure 1:
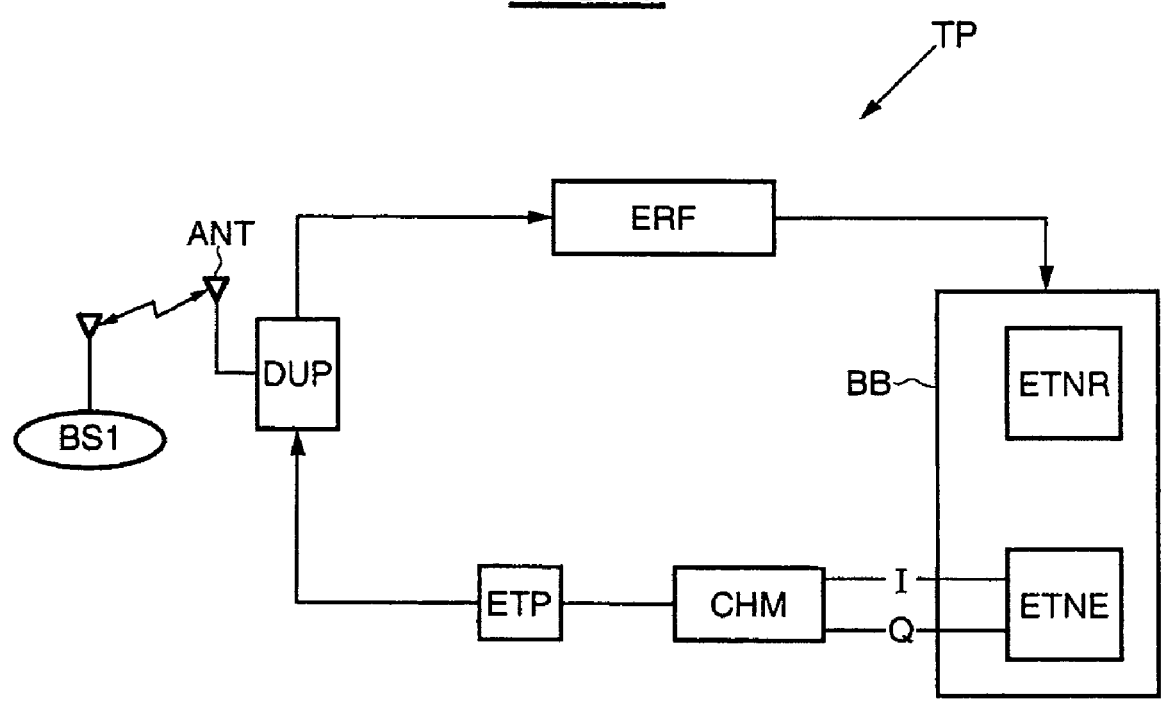
FIG. 1 illustrates diagrammatically the structure of a cellular mobile telephone according to the present invention.

In FIG. 1, the reference TP designates a remote terminal, such as a cellular mobile telephone, which is in communication with a base station BS1, for example, according to a communication scheme of the CDMA-FDD type (for example, the UTRA-FDD standard). The cellular mobile telephone TP comprises, in a conventional manner, a radio frequency analog stage ERF connected to an antenna ANT by way of a duplexer DUP, so as to receive an input signal.

Conventionally, the analog stage ERF comprises a low noise amplifier and two processing pathways including mixers, conventional filters and amplifiers. The two mixers respectively receive from a phase-lock loop two signals exhibiting a 90° mutual phase difference. After frequency transposition in the mixers, the two processing pathways respectively define two streams I (direct stream) and Q (quadrature stream) according to terminology well known to those skilled in the art.

After digital conversion in analog/digital converters ADC, the two streams I and Q are delivered to a reception processing stage ETNR. This processing stage ETNR comprises, in a conventional manner, a receiver commonly designated as a Rake receiver followed by demodulation circuitry for demodulating the spectrum delivered by the Rake receiver. The processing stage ETNR also comprises in a conventional manner a source decoder for performing a source decoding, as readily understood by those skilled in the art.

The baseband BB processing block comprises, in addition to the processing stage ETNR, a transmission processing stage ETNE which performs, in a conventional manner, the processing operations of source coding, spreading of the symbols, and modulation so as to deliver the two streams I and Q to transmission circuitry CHM this is of conventional structure.

The transmission circuitry CHM includes at the front end, in particular, digital/analog converters, as well as mixers for performing a frequency transposition to the transmission frequency. The transposition signals are delivered by a phase-lock loop (not represented here for the sake of simplification) likewise controlled by automatic frequency-control circuitry incorporated into the transmission processing stage ETNE. The transmission circuitry CHM is conventionally followed by a power amplifier stage ETP connected to the antenna by the duplexer DUP.

Values of noise level not to be exceeded at the level of the antenna connector are defined in specification TS25 101 by the 3GPP standardization group. These noise levels thus translate into the transmission template illustrated in FIG. 2, and are valid for a transmission according to the W-CDMA standard.

It may be observed in this template that although the useful transmission band is situated between 1920 MHz and 1980 MHz, a noise level equal to −117 dBm per hertz between 925 MHz and 935 MHz and a level of −129 dBm per hertz between 935 MHz and 960 MHz should not be exceeded. These values are fixed in such a way so as not to disturb GSM receptions performed by other telephones. Likewise, outside of this useful band, the noise level should not exceed −121 dBm per hertz between 1805 MHz and 1880 MHz so as not to disturb reception according to the DCS standard.

The power amplification device according to the invention will then be constructed to satisfy the requirements of the signal/noise ratio in the useful band of the signal, and the noise level requirements outside of the useful band.

Figure 3:
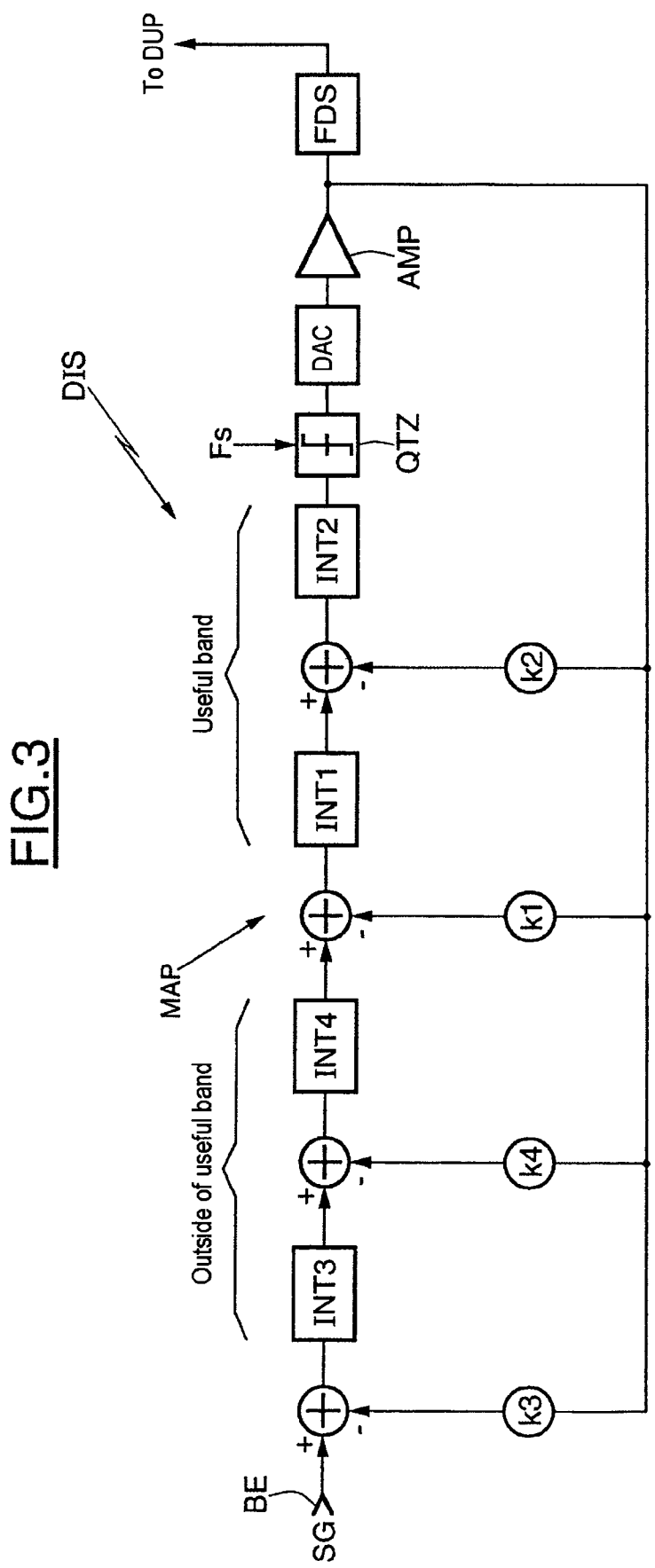
FIG. 3 illustrates diagrammatically a first embodiment of a power amplification device according to the present invention.

More precisely, as illustrated in FIG. 3, the power amplification device DIS comprises an input terminal BE that receives the signal SG to be amplified, and is followed by power amplification means or circuitry MAP of the delta-sigma type. The signal SG, present at the input terminal BE and originating from a mixer that has transposed the signal SG into the radio frequency domain, is processed by a succession of adders/subtractors and integration circuitry INT1–INT3 respectively formed by frequency selector networks.

The signal delivered at the output of the frequency selector network INT2 is then quantized on one bit in quantization circuitry QTZ. The signal delivered by the quantization circuitry QTZ, which may be a square waveform, is then amplified in a class E power amplifier AMP (that is, operating on square wave signals) after digital-to-analog conversion DAC.

The output of the amplifier is looped back to the inputs of the adders/subtractors by four continuous gains referenced k1–k4 respectively in this example. The output of the amplifier AMP is also linked to the input of a post-amplifier filter FDS, which is a bandpass filter, whose output is linked to the duplexer DUP.

The power amplification circuitry MAP of the delta-sigma type, has, for reasons of simplification, a global order equal to 4 (since the number of integrators is equal to 4). The two frequency selector networks INT1 and INT2 are inductive capacitive networks tuned respectively to frequencies in the useful signal band, that is, between 1920 and 1980 MHz in the present case. More precisely, the network INT1 can be tuned, for example, to the frequency of 1940 MHz while the network INT2 can be tuned to the frequency of 1960 MHz.

In a general manner, the resonant frequencies of the various frequency selector networks set the zeros of the transfer function of the noise, that is, the frequencies at which the quantization noise is eliminated. The two zeros of the transfer function, corresponding to the two resonant frequencies of the networks INT1 and INT2, have the objective of satisfying the requirements of two signal/noise ratios in the signal's useful transmission band. Moreover, the two frequency selector networks INT3, INT4 are tuned to frequencies outside the useful band. Each of these networks therefore makes it possible to eliminate the quantization noise at the frequency to which it is tuned.

Figure 2:
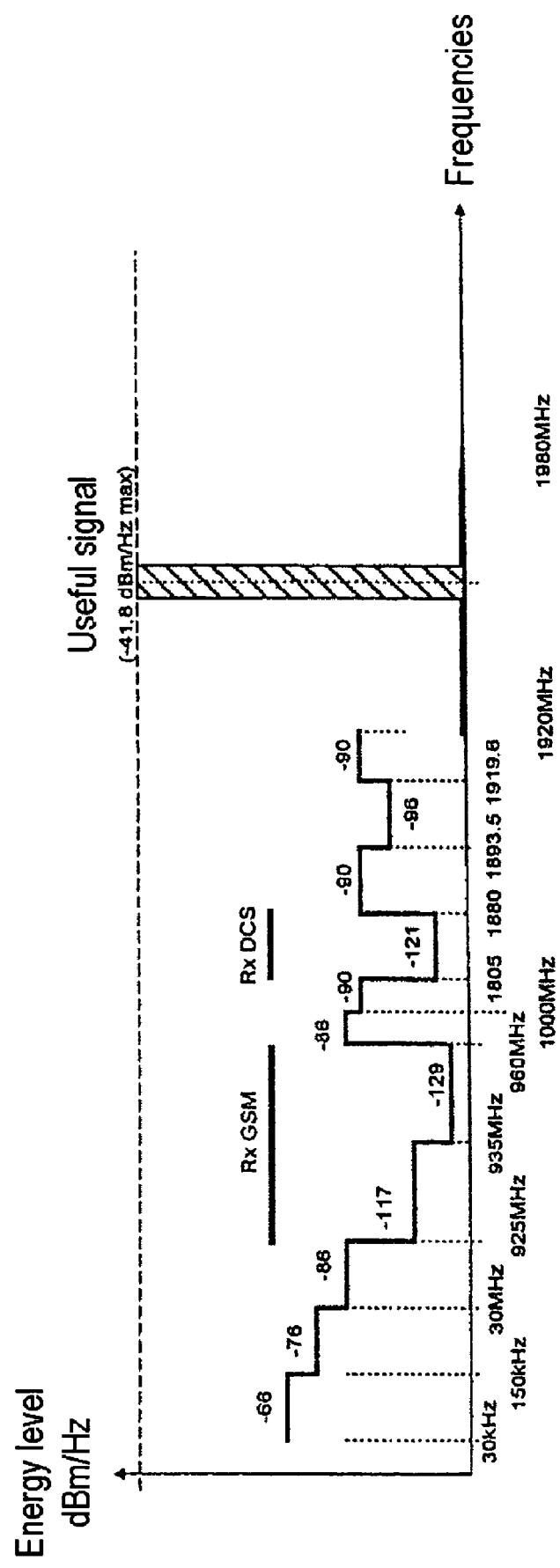
FIG. 2 is a graph illustrating an exemplary noise template for a transmission using the CDMA standard according to the present invention.

In the present case, the networks INT3 and INT4 can be tuned respectively to frequencies equal to 930 and 950 MHz, thereby making it possible to reduce the noise level in the GSM reception band lying between 925 MHz and 960 MHz (FIG. 2). The poles of the transfer function are fixed by the continuous feedback gains k1–k4, and are placed in such a way to stabilize the entire system.

Thus, by limiting the noise level to predetermined frequencies outside of the useful band of the signal, and directly at the level of the power amplification circuitry MAP, the invention makes it possible to relax the filtering constraint on the post-amplifier filter, which typically may be on the order of 20 decibels.

Figure 4:
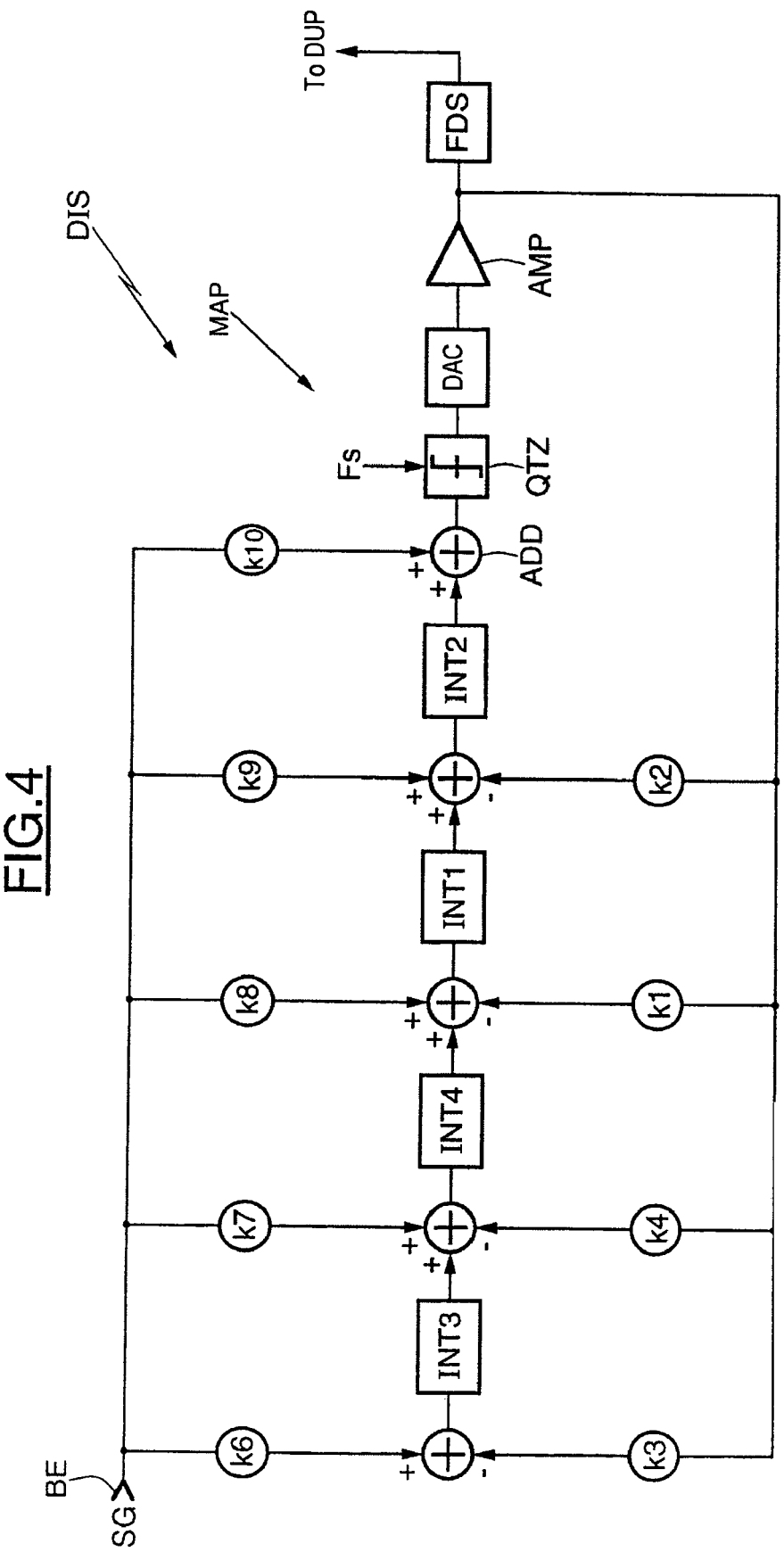
FIG. 4 illustrates diagrammatically a second embodiment of the power amplification device according to the present invention.

Reference will now be made more particularly to FIG. 4 which illustrates another embodiment of a power amplification device according to the invention. In this embodiment, the power amplification device DIS is distinguished from that illustrated in FIG. 3 by the fact that provision is made for at least one signal gain (signal amplifier) between the input terminal BE and the power amplification circuitry MAP. In this instance, provision is made for 5 signal amplifiers k6–k10, connected respectively between the input band BE and the adders/subtractors upstream of the networks INT–INT4 as well as between the input terminal BE and an additional adder ADD between the frequency selector network INT2 and the quantization circuitry QTZ. Such an embodiment provides a further degree of freedom for setting the zeros of the transfer function of the signal.

Specifically, the zeros and the poles of the transfer function of the noise are set by the frequencies of the frequency selector networks as well as by the feedback gains k1–k4. Moreover, the poles of the transfer function of the signal are identical to the poles of the transfer function of the noise.

If a provision is not made for at least two signal gains between the input terminal BE and the input of the quantization circuitry QTZ (directly or indirectly by way of the frequency selector networks) then the zeros of the transfer function of the signal would automatically be set once the feedback gains and the tuning frequencies of the frequency selector networks have been set. However, in the presence of at least two signal gains, it is then possible to adjust the location of the zeros of the signal transfer function.

Also, locating the zeros of the signal transfer function outside the useful band (based on the relative values of the signal gains) makes it possible to ensure filtering of the input signal SG and to eliminate some nuisance noise at predetermined frequencies outside of the useful band. It is thus possible to relax the filtering constraint on the elements of the transmission circuitry that are upstream of the power amplification device.

Moreover, by altering the absolute value of the signal gains it is possible to adjust the gain of the amplifier, in particular in the useful transmission band, and to do so without degrading the signal/noise ratio. Moreover, since these gains act only on the input signal, the input dynamic swing of the power amplification circuitry is thus reduced. These signal gains may also possibly be programmable.

Moreover, the presence of such signal gains makes it possible to reduce the output power of the mixer disposed upstream of the power amplification device. Thus, 15 dB of gain in the signal allows a decrease of 15 dB in the maximum power necessary at the output of the mixer.

Finally, the linearity requirements of the system are most constraining on the input stages of the power amplification circuitry, that is, the stages corresponding to the gains k3 and k6. Also, the more one moves towards the quantization circuitry, the more the constraints on the linearity performance of the intermediate blocks are relaxed.

That which is claimed is:

1. A power amplification device comprising:
   an input for receiving a signal having a desired frequency band; and
   power amplification means of the delta-sigma type connected to the input, and having an order greater than or equal to one in the desired frequency band and having an order greater than or equal to one outside the desired frequency band.

2. A power amplification device according to claim 1, wherein said power amplification means comprises:
   at least one first frequency selector network tuned to a frequency within the desired frequency band; and
   at least one second frequency selector network tuned to a frequency outside the desired frequency band.

3. A power amplification device according to claim 1, further comprising at least one signal amplifier connected between the input and said power amplification means.

4. A power amplification device according to claim 3, wherein said at least one signal amplifier comprises a plurality of signal amplifiers.

5. A power amplification device according to claim 4, wherein a number of said plurality of signal amplifiers is equal to the order in the desired frequency band and the order outside the desired frequency band of said power amplification means plus one.

6. A power amplification device according to claim 5, wherein the received signal has a noise transfer function associated therewith; and wherein each signal amplifier has a respective gain, and a value of each respective gain is set to locate zeros of the noise transfer function outside the desired frequency band.

7. A power amplification device according to claim 6, wherein each signal amplifier is programmable for setting its respective gain.

8. A power amplification device according to claim 1, wherein said power amplification means is configured so that the power amplification device is an integrated circuit.

9. A power amplification device comprising:
   an input for receiving a signal having a desired frequency band; and
   power amplifier circuitry connected to the input and comprising
      at least one first frequency selector network tuned to a frequency within the desired frequency band and having an order greater than or equal to one, and
      at least one second frequency selector network tuned to a frequency outside the desired frequency band and having an order greater than or equal to one.

10. A power amplification device according to claim 9, further comprising at least one signal amplifier connected between the input and said power amplifier circuitry.

11. A power amplification device according to claim 10, wherein said at least one signal amplifier comprises a plurality of signal amplifiers.

12. A power amplification device according to claim 11, wherein a number of said plurality of signal amplifiers is equal to the order in the desired frequency band plus and the order outside the desired frequency band of said power amplifier circuitry plus one.

13. A power amplification device according to claim 10, wherein the received signal has a noise transfer function associated therewith; and wherein each signal amplifier has a respective gain, and a value of each respective gain is set to locate zeros of the noise transfer function outside the desired frequency band.

14. A power amplification device according to claim 13, wherein each signal amplifier is programmable for setting its respective gain.

15. A cellular telephone comprising:
   transmission circuitry for receiving a signal having a desired frequency band to be transmitted; and
   a power amplification device connected to said transmission circuitry and comprising having an order greater than or equal to one in the desired frequency band and having an order greater than or equal to one outside the desired frequency band.

16. A cellular telephone according to claim 15, wherein said power amplification device comprises:
   at least one first frequency selector network tuned to a frequency within the desired frequency band; and
   at least one second frequency selector network tuned to a frequency outside the desired frequency band.

17. A cellular telephone according to claim 15, further comprising a plurality of signal amplifiers connected between an input of said power amplification device and said at least one first and second frequency selector networks.

18. A cellular telephone according to claim 17, wherein a number of said plurality of signal amplifiers is equal to the order in the desired frequency band and the order outside the desired frequency band of said power amplification device plus one.

19. A cellular telephone according to claim 17, wherein the received signal has a noise transfer function associated therewith; and wherein each signal amplifier has a respective gain, and a value of each respective gain is set to locate zeros of the noise transfer function outside the desired frequency band.

20. A cellular telephone according to claim 17, wherein each signal amplifier is programmable for setting its respective gain.

21. A method for forming a power amplification device, the method comprising:
   providing an input for receiving a signal having a desired frequency band;
   connecting power amplification circuitry of the delta-sigma type to the input, the power amplification circuitry having an order greater than or equal to one in the desired frequency band and having an order greater than or equal to one outside the desired frequency band.

22. A method according to claim 21, wherein the order of the power amplification circuitry in the desired frequency band is based upon at least one first frequency selector network tuned to a frequency within the desired frequency band; and wherein the order of the power amplification circuitry outside the desired frequency band is based upon at least one second frequency selector network tuned to a frequency outside the desired frequency band.

23. A method according to claim 21, further comprising connecting a plurality of signal amplifiers between the input and the power amplification circuitry.

24. A method according to claim 23, wherein a number of the plurality of signal amplifiers is equal to the order in the desired frequency band and the order outside the desired frequency band of the power amplification circuitry plus one.

25. A method according to claim 23, wherein the received signal has a noise transfer function associated therewith; and wherein each signal amplifier has a respective gain, and a value of each respective gain is set to locate zeros of the noise transfer function outside the desired frequency band.

26. A method according to claim 25, further comprising programming each signal amplifier for setting its respective gain.

* * * * *

UNITED STATES PATENT AND TRADEMARK OFFICE
CERTIFICATE OF CORRECTION

PATENT NO. : 7,177,605 B2 Page 1 of 1
APPLICATION NO. : 10/754465
DATED : February 13, 2007
INVENTOR(S) : Cerisier et al.

It is certified that error appears in the above-identified patent and that said Letters Patent is hereby corrected as shown below:

Column 8, Line 17    Delete: "comprising having"

Insert: -- having --

Signed and Sealed this

Thirty-first Day of July, 2007

JON W. DUDAS
*Director of the United States Patent and Trademark Office*